United States Patent
Fukunaga et al.

(10) Patent No.: US 12,290,898 B2
(45) Date of Patent: May 6, 2025

(54) SUBSTRATE PROCESSING METHOD AND SUBSTRATE PROCESSING APPARATUS

(71) Applicant: Tokyo Electron Limited, Tokyo (JP)

(72) Inventors: Nobutaka Fukunaga, Kumamoto (JP); Tomohiro Kaneko, Kumamoto (JP); Takeshi Matsumoto, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 232 days.

(21) Appl. No.: 17/776,639

(22) PCT Filed: Nov. 2, 2020

(86) PCT No.: PCT/JP2020/041070
§ 371 (c)(1),
(2) Date: May 13, 2022

(87) PCT Pub. No.: WO2021/095586
PCT Pub. Date: May 20, 2021

(65) Prior Publication Data
US 2022/0402087 A1    Dec. 22, 2022

(30) Foreign Application Priority Data
Nov. 15, 2019    (JP) .................... 2019-207441

(51) Int. Cl.
B24B 7/04    (2006.01)
B24B 49/05    (2006.01)
H01L 21/304    (2006.01)

(52) U.S. Cl.
CPC ............... B24B 7/04 (2013.01); B24B 49/05 (2013.01); H01L 21/304 (2013.01)

(58) Field of Classification Search
CPC ............... H01L 21/687; H01L 21/304; H01L 21/67092; H01L 22/20; H01L 22/12;
(Continued)

(56) References Cited

FOREIGN PATENT DOCUMENTS

JP    2014226749 A  * 12/2014  ............ B24B 49/04
JP    2017-056523 A    3/2017
(Continued)

OTHER PUBLICATIONS

International Search Report of PCT/JP2020/041070 dated Jan. 26, 2021.

*Primary Examiner* — Eric J Rosen
*Assistant Examiner* — John C Merino
(74) *Attorney, Agent, or Firm* — Shih IP Law Group, PLLC

(57) ABSTRACT

A substrate processing method of grinding a first substrate in a combined substrate in which the first substrate and a second substrate are bonded to each other includes measuring a total thickness distribution of the combined substrate; measuring a thickness distribution of the first substrate; calculating a thickness distribution of the second substrate by subtracting the thickness distribution of the first substrate from the total thickness distribution of the combined substrate; deciding a relative inclination between a substrate holder configured to hold the combined substrate and a grinder configured to grind the combined substrate, based on the thickness distribution of the second substrate; and grinding the first substrate while holding the combined substrate at the inclination which is decided.

6 Claims, 6 Drawing Sheets

(58) Field of Classification Search
CPC ........... B24B 7/228; B24B 1/00; B24B 49/00;
B24B 49/05; B24B 49/12; B24B 49/02;
B24B 49/03; B24B 49/04; B24B 49/045
See application file for complete search history.

(56) References Cited

FOREIGN PATENT DOCUMENTS

| | | | | |
|---|---|---|---|---|
| JP | 2017113811 | A | * | 6/2017 |
| JP | 2019-093517 | A | | 6/2019 |
| JP | 6552930 | B2 | * | 7/2019 |

* cited by examiner

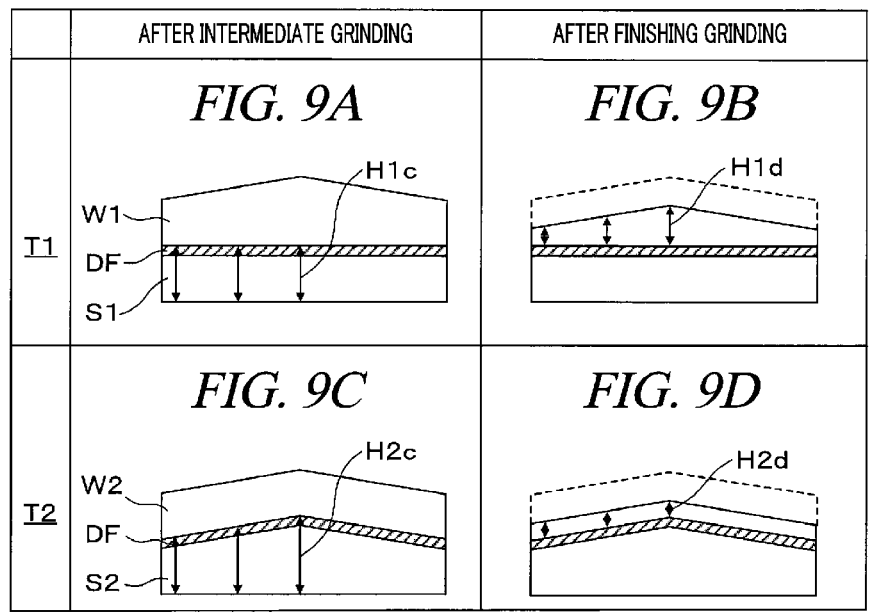
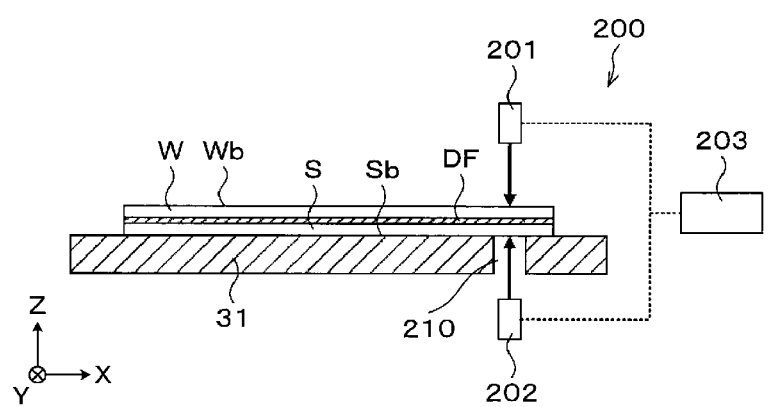
FIG. 10

SUBSTRATE PROCESSING METHOD AND SUBSTRATE PROCESSING APPARATUS

CROSS-REFERENCE TO RELATED APPLICATIONS

This Application is a U.S. national phase application under 35 U.S.C. § 371 of PCT Application No. PCT/JP2020/041070 filed on Nov. 2, 2020, which claims the benefit of Japanese Patent Application No. 2019-207441 filed on Nov. 15, 2019, the entire disclosures of which are incorporated herein by reference.

TECHNICAL FIELD

The various aspects and embodiments described herein pertain generally to a substrate processing method and a substrate processing apparatus.

BACKGROUND

Patent Document 1 discloses a grinding method for a plate-shaped workpiece composed of a first plate-shaped workpiece and a second plate-shaped workpiece bonded to each other. The grinding method includes a process of measuring a thickness at at least three measurement positions of the first plate-shaped workpiece held by a holding table, a process of adjusting parallelism of the first plate-shaped workpiece based on the measured thicknesses, and a process of grinding the second plate-shaped workpiece after the adjustment of the parallelism.

PRIOR ART DOCUMENT

Patent Document 1: Japanese Patent Laid-open Publication No. 2014-226749

DISCLOSURE OF THE INVENTION

Means for Solving the Problems

In an exemplary embodiment, there is provided a substrate processing method of grinding a first substrate in a combined substrate in which the first substrate and a second substrate are bonded to each other. The substrate processing method includes measuring a total thickness distribution of the combined substrate; measuring a thickness distribution of the first substrate; calculating a thickness distribution of the second substrate by subtracting the thickness distribution of the first substrate from the total thickness distribution of the combined substrate; deciding a relative inclination between a substrate holder configured to hold the combined substrate and a grinder configured to grind the combined substrate, based on the thickness distribution of the second substrate; and grinding the first substrate while holding the combined substrate at the inclination which is decided.

BRIEF DESCRIPTION OF THE DRAWINGS

FIG. 9A to FIG. 9D are explanatory diagrams illustrating an example of main process of a processing according to another exemplary embodiment.

FIG. 10 is a side view schematically illustrating an example configuration of a total thickness measuring unit according to the exemplary embodiment.

DETAILED DESCRIPTION

Recently, in a manufacturing process for a semiconductor device, in a combined substrate in which a semiconductor substrate (hereinafter, referred to as "first substrate") having devices such as a plurality of electronic circuits formed on a front surface thereof and a second substrate are bonded to each other, the first substrate is thinned by grinding a rear surface thereof.

Figure 1:
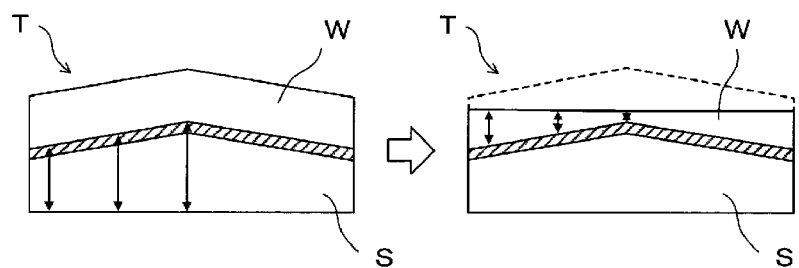
FIG. 1 is an explanatory diagram schematically illustrating degradation of TTV of a conventional first wafer.

The thinning of the first substrate is performed by bringing a grinding whetstone into contact with the rear surface of the first substrate in the state that a rear surface of the second substrate is held by a substrate holder. However, when performing the grinding of the first substrate in this way, if a thickness distribution in the diametrical direction of the second substrate held by the substrate holder is not uniform, the degree of flatness (TTV: Total Thickness Variation) of the first substrate after being ground may be degraded. Specifically, as shown in FIG. 1, in a portion within a surface of a combined substrate T where a thickness of a second substrate S is small, a thickness of a first substrate W becomes large, whereas in a portion where the thickness of the second substrate S is large, the thickness of the first substrate W becomes small.

The grinding method disclosed in the aforementioned Patent Document 1 is a method for grinding the first substrate (second plate-shaped workpiece) to a uniform thickness by detecting non-uniformity in the thickness of the second substrate (first plate-shaped workpiece) and adjusting an inclination of the substrate holder (holding table). In the grinding method disclosed in Patent Document 1, the thickness of the second substrate (first plate-shaped workpiece) is directly calculated by measurement light emitted from a non-contact type thickness measuring device provided above the combined substrate (plate-shaped workpiece). Further, the measurement light penetrates the first substrate (second plate-shaped workpiece).

However, when devices are formed on the front surface of the first substrate as stated above, for example, that is, when a device layer, which is a metal film, is interposed between the first substrate and the second substrate, the thickness of the second substrate including the metal film may not be calculated properly. To elaborate, since the measurement light (for example, IR light) cannot penetrate the device layer which is the metal film, the thickness of the second substrate including the metal film can be measured properly from neither the first substrate side nor the second substrate side. Since a thickness distribution of the second substrate including the metal film cannot be measured appropriately for this reason, an inclination of the grinding whetstone to be brought into contact with the first substrate, that is, a grinding amount may not calculated appropriately, making it difficult to improve the degree of flatness of the first substrate after being ground. In this regard, there is still a room for improvement in the conventional grinding method for grinding the first substrate to the uniform thickness.

In this regard, exemplary embodiments of the present disclosure provides a technique enabling to appropriately improve flatness of a first substrate in a combined substrate in which the first substrate and a second substrate are bonded to each other. Hereafter, a processing apparatus as a substrate processing apparatus and a processing method as a substrate processing method according to an exemplary embodiment will be described with reference to the accompanying drawings. Further, in the present specification and the drawings, parts having substantially the same functions and configurations will be assigned same reference numerals, and redundant description thereof will be omitted.

Figure 2:
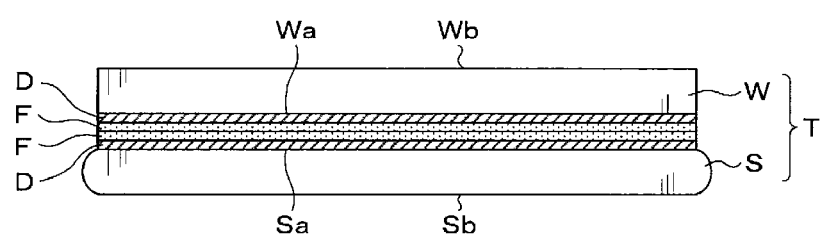
FIG. 2 is an explanatory diagram illustrating an example structure of a combined wafer.

In a processing apparatus 1 to be described later according to an exemplary embodiment, a processing is performed on a combined wafer T as a combined substrate in which a first wafer W as a first substrate and a second wafer S as a second substrate are bonded to each other as shown in FIG. 2. In the processing apparatus 1, the first wafer W is thinned. Hereinafter, in the first wafer W, a surface to be bonded to the second wafer S will be referred to as a front surface Wa, and a surface opposite to the front surface Wa will be referred to as a rear surface Wb. Likewise, in the second wafer S, a surface to be bonded to the first wafer W will be referred to as a front surface Sa, and a surface opposite to the front surface Sa will be referred to as a rear surface Sb.

The first wafer W is a semiconductor wafer such as, but not limited to, a silicon wafer, and has, on the front surface Wa thereof, a device layer D including a plurality of devices. Further, a surface film F is formed on the device layer D, and the device layer D is bonded to the second wafer S with this surface film F therebetween. The surface film F may be, by way of non-limiting example, an oxide film (a $SiO_2$ film or a TEOS film), a SiC film, a SiCN film, an adhesive, or the like. Further, to suppress a peripheral portion of the first wafer W from having a sharp pointed shape (a so-called knife edge shape) by a grinding processing in the processing apparatus 1, the peripheral portion is previously removed. The peripheral portion may be in the range of e.g., 0.5 mm to 3 mm from an edge of the first wafer W in the diametrical direction thereof. Further, in case that the device layer D and the surface film F are formed on the second wafer S, the first wafer W may not be provided with the device layer D and the surface film F.

The second wafer S has the same configuration as that of the first wafer W, for example, and the device layer D and the surface film F are formed on the front surface Sa thereof. Further, a peripheral portion of the second wafer S is chamfered, and the thickness of the peripheral portion decreases toward a leading end thereof on a cross section thereof. The second wafer S does not need to be a device wafer on which the device layer D is formed, and it may be, for example, a support wafer configured to support the first wafer W. In this case, the second wafer S functions as a protection member configured to protect the device layer D on the front surface Wa of the first wafer W.

In addition, in the following description, in order to avoid complication of illustration, the device layer D and the surface film F may be marked together, and they may sometimes be referred to as a device layer and surface film "DF".

Figure 3:
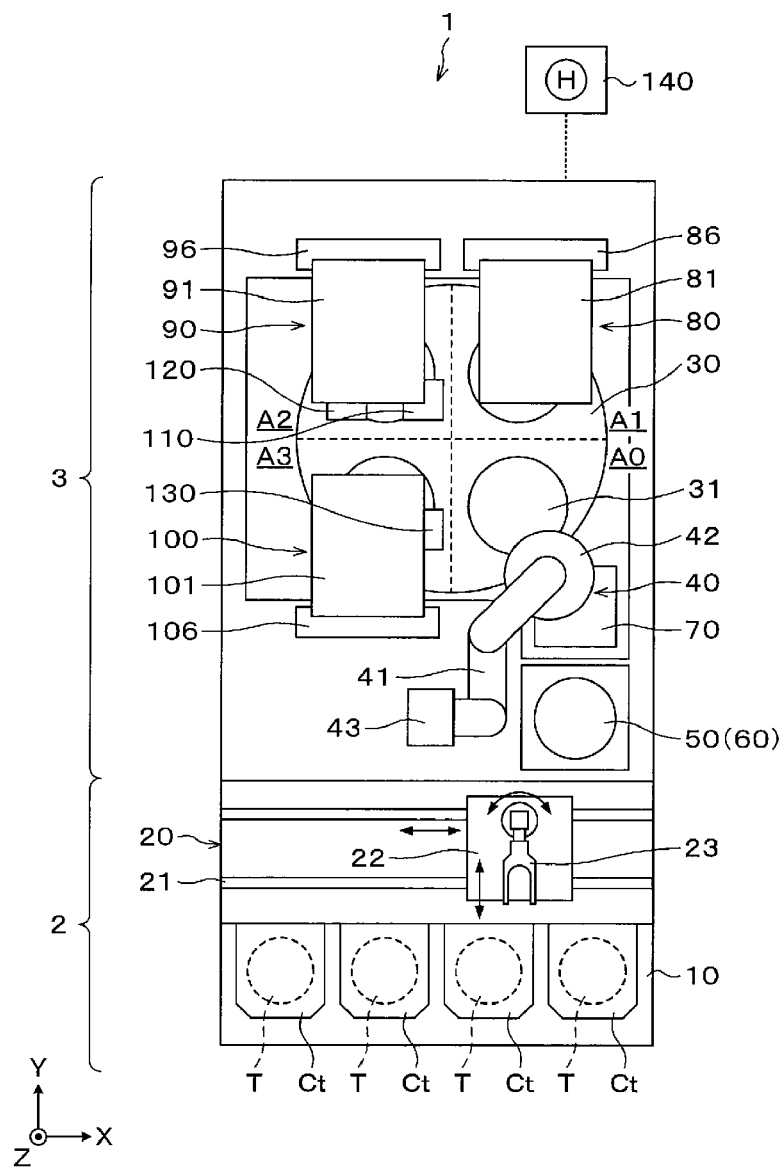
FIG. 3 is a plan view schematically illustrating an example configuration of a processing apparatus.

As depicted in FIG. 3, the processing apparatus 1 has a structure in which a carry-in/out station 2 and a processing station 3 are connected as one body. In the carry-in/out station 2, a cassette Ct capable of accommodating a plurality of combined wafers T therein is carried to/from the outside, for example. The processing station 3 is equipped with various kinds of processing apparatuses each configured to perform a required processing on the combined wafer T.

The carry-in/out station 2 is equipped with a cassette placing table 10. In the shown example, a plurality of, for example, four cassettes Ct can be arranged on the cassette placing table 10 in a row in the X-axis direction. Further, the number of the cassettes Ct placed on the cassette placing table 10 is not limited to the example of the present exemplary embodiment but may be selected as required.

In the carry-in/out station 2, a wafer transfer section 20 is provided adjacent to the cassette placing table 10 on the positive Y-axis side of the cassette placing table 10. Provided in the wafer transfer section 20 is a wafer transfer device 22 configured to be movable on a transfer path 21 which is elongated in the X-axis direction. The wafer transfer device 22 is equipped with a transfer fork 23 configured to hold and transfer the combined wafer T. The transfer fork 23 attracts and holds the combined wafer T with its biforked leading ends. The transfer fork 23 transfers the combined wafer T before and after being subjected to the grinding processing, for example. The transfer fork 23 is configured to be movable in a horizontal direction and a vertical direction and pivotable around a horizontal axis and a vertical axis.

Further, the configuration of the wafer transfer device 22 is not limited to the present exemplary embodiment, and various other configurations may be adopted. By way of example, the wafer transfer device 22 may be equipped with two transfer forks 23 respectively configured to transfer the combine wafer T before being subjected to the grinding processing and the combined wafer T after being subjected to the grinding processing.

In the processing station 3, processings such as grinding and cleaning is performed on the combined wafer T. The processing station 3 includes a rotary table 30, a transfer unit 40, an alignment unit 50, a first cleaning unit 60, a second cleaning unit 70, a rough grinding unit 80, an intermediate grinding unit 90, and a finishing grinding unit 100.

The rotary table 30 is configured to be rotated by a rotating mechanism (not shown). Four chucks 31 each of which serves as a substrate holder configured to attract and hold the combined wafer T are provided on the rotary table 30. The chucks 31 are arranged on a circle concentric with the rotary table 30 at a regular distance therebetween, that is, at an angular distance of 90 degrees therebetween. The four chucks 31 are configured to be moved to a delivery position A0 and processing positions A1 to A3 as the rotary table 30 is rotated. Further, each of the chucks 31 is configured to be rotated around a vertical axis by a rotating mechanism (not shown).

As depicted in FIG. 3, in the present exemplary embodiment, the delivery position A0 is a position on the positive X-axis and negative Y-axis side of the rotary table 30. The second cleaning unit 70, the alignment unit 50, and the first cleaning unit 60 are disposed on the negative Y-axis side of the delivery position A0. The alignment unit 50 and the first cleaning unit 60 are stacked in this order from above. The first processing position A1 is a position on the positive X-axis and positive Y-axis side of the rotary table 30, and the rough grinding unit 80 is disposed thereat. The second processing position A2 is a position on the negative X-axis and positive Y-axis side of the rotary table 30, and the intermediate grinding unit 90 is disposed thereat. The third processing position A3 is a position on the negative X-axis and negative Y-axis side of the rotary table 30, and the finishing grinding unit 100 is disposed thereat.

The chuck 31 may be, for example, a porous chuck. The chuck 31 attracts and holds the rear surface Sb of the second wafer S that constitutes the combined wafer T. When viewed from the side, a front surface of the chuck 31, that is, a holding surface of the combined wafer T has a protruding shape with a central portion thereof protruding higher than an end portion thereof. Further, since the protrusion of this central portion is minute, illustration of the protruding shape of the chuck 31 will be omitted in the following description.

Figure 4:
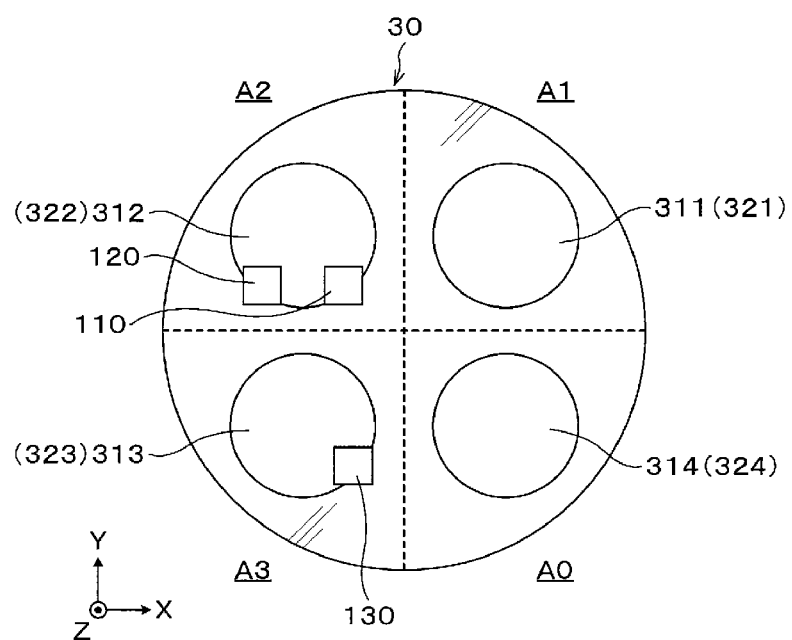
FIG. 4 is a plan view schematically illustrating an example configuration of a rotary table.

Each chuck 31 is held by a chuck base 32. In the following description, as shown in FIG. 4, the four chuck bases positioned at the processing positions A1 to A3 and the delivery position A0 may sometimes be respectively referred to as a first chuck base 321, a second chuck base 322, a third chuck base 323, and a fourth chuck base 324. The chuck bases 321 to 324 hold the chucks 311 to 314, respectively.

Figure 5:
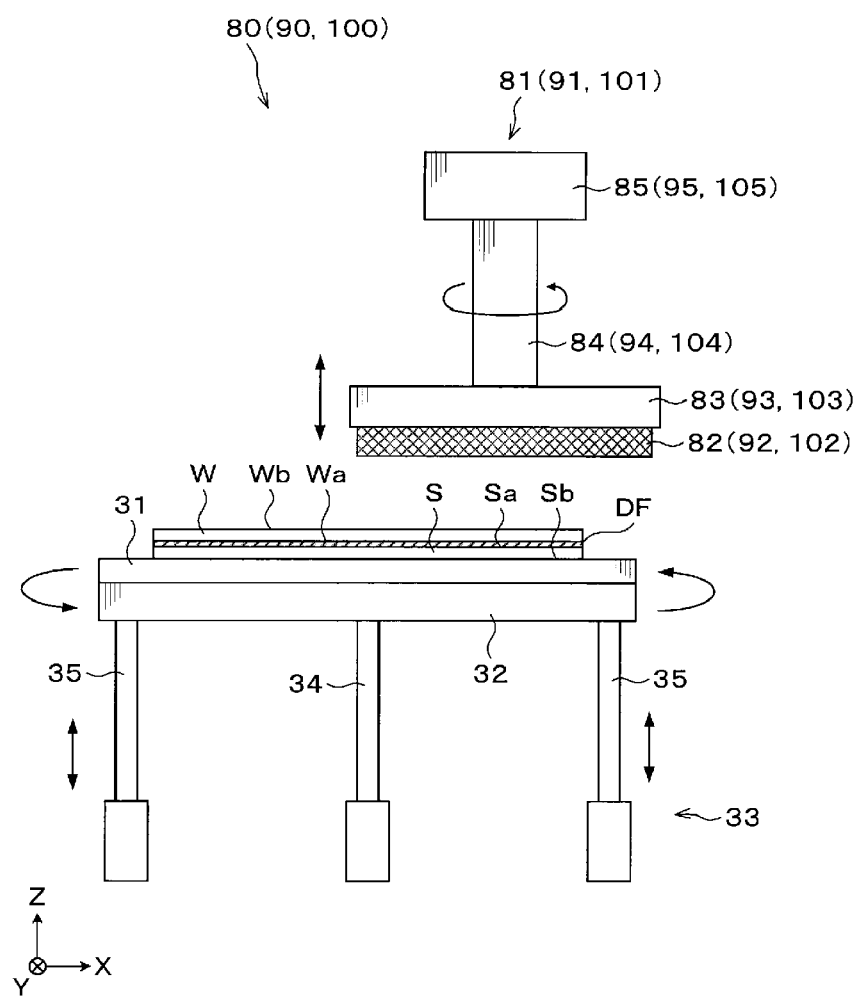
FIG. 5 is a side view schematically illustrating an example configuration of each grinding unit.

As illustrated in FIG. 5, the chuck base 32 is provided with an inclination adjuster 33 configured to adjust an inclination of the chuck 31 and the chuck base 32 from a horizontal direction. The inclination adjuster 33 has a fixed shaft 34 and a plurality of elevating shafts 35 provided on a bottom surface of the chuck base 32. Each of the elevating shafts 35 is configured to be extensible/contractible, and moves the chuck base 32 up and down. By using the inclination adjuster 33 to raise or lower one end of an outer periphery of the chuck base 32 in a vertical direction with respect to the other end thereof (a position corresponding to the fixed shaft 34), the chuck 31 and the chuck base 32 can be inclined. Thus, it is possible to adjust an inclination of the rear surface Wb of the first wafer W as a grinding surface with respect to grinding whetstones belonging to the various kinds of grinding units at the processing positions A1 to A3.

Further, the configuration of the inclination adjuster 33 is not limited to the above-described example, and any of various other configurations may be adopted as long as it is capable of adjusting the relative angle (parallelism) of the first wafer W with respect to the grinding whetstone.

As depicted in FIG. 3, the transfer unit 40 is a multi-joint robot equipped with a plurality of, for example, three arms 41. Each of the three arms 41 is configured to be rotatable. The arm 41 at a leading end is equipped with a transfer pad 42 configured to attract and hold the combined wafer T. The arm 41 at a base end is mounted to an elevating mechanism 43 configured to move this arm 41 in a vertical direction. The transfer unit 40 having this configuration is capable of transferring the combined wafer T to/from the delivery position A0, the alignment unit 50, the first cleaning unit 60, and the second cleaning unit 70.

In the alignment unit 50, a direction of the combined wafer T before being subjected to the grinding processing in a horizontal direction is adjusted. By way of example, while rotating the combined wafer T held by a spin chuck (not shown), a position of a notch of the first wafer W is detected by a detector (not shown), and by adjusting the position of the notch, the direction of the combined wafer T in the horizontal direction is adjusted.

In the first cleaning unit 60, the rear surface Wb of the first wafer W after being subjected to the grinding processing is cleaned, and, more specifically, cleaned by spinning. By way of example, while rotating the combined wafer T held by a spin chuck (not shown), a cleaning liquid is supplied to the rear surface Wb of the first wafer W from a cleaning liquid nozzle (not shown). The supplied cleaning liquid diffuses on the rear surface Wb, so that the rear surface Wb is cleaned.

In the second cleaning unit 70, the rear surface Sb of the second wafer S is cleaned in the state that the combined wafer T after being subjected to the grinding processing is held by the transfer pad 42, and, also, the transfer pad 42 is cleaned.

In the rough grinding unit 80, the rear surface Wb of the first wafer W is roughly ground. The rough grinding unit 80 is equipped with a rough grinder 81. As depicted in FIG. 5, the rough grinder 81 has a rough grinding wheel 82, a mount 83, a spindle 84, and a driver 85. The rough grinding wheel 82 is equipped with a rough grinding whetstone on a bottom surface thereof, and has an annular shape. The rough grinding wheel 82 is supported on the mount 83. The mount 83 is provided with the driver 85 with the spindle 84 therebetween. The driver 85 incorporates therein, for example, a motor (not shown), and serves to rotate the rough grinding wheel 82 and move it in a vertical direction along a supporting column 86 shown in FIG. 3. In the rough grinding unit 80, by respectively rotating the chuck 31 and the rough grinding wheel 82 while keeping the first wafer W of the combined wafer T held by the chuck 31 in contact with a part of an arc of the rough grinding wheel 82, the rear surface Wb of the first wafer W is roughly ground.

In the intermediate grinding unit 90, the rear surface Wb of the first wafer W is ground to an intermediate level. The configuration of the intermediate grinding unit 90 is substantially the same as the configuration of the rough grinding unit 80, as shown in FIG. 3 and FIG. 5. The intermediate grinding unit 90 includes an intermediate grinder 91, an intermediate grinding wheel 92, a mount 93, a spindle 94, a driver 95, and a supporting column 96. Further, a particle size of abrasive grains of the intermediate grinding whetstone is smaller than a particle size of abrasive grains of the rough grinding whetstone.

In the finishing grinding unit 100, the rear surface Wb of the first wafer W is ground finely. The configuration of the finishing grinding unit 100 is substantially the same as the configuration of the rough grinding unit 80 and the intermediate grinding unit 90, as illustrated in FIG. 3 and FIG. 5. The finishing grinding unit 100 includes a finishing grinder 101, a finishing grinding wheel 102, a mount 103, a spindle 104, a driver 105, and a supporting column 106. Further, a particle size of abrasive grains of the finishing grinding whetstone is smaller than the particle size of the abrasive grains of the intermediate grinding whetstone.

Furthermore, the processing station 3 is equipped with, as depicted in FIG. 4, a total thickness measuring unit 110 configured to measure the total thickness of the combined wafer T upon the completion of the intermediate grinding, a thickness measuring unit 120 configured to measure the thickness of the first wafer W upon the completion of the intermediate grinding, and a thickness measuring unit 130 configured to measure the thickness of the first wafer W upon the completion of the finishing grinding. The total thickness measuring unit 110 and the thickness measuring unit 120 are provided at, for example, the processing position A2. The thickness measuring unit 130 is provided at the processing position A3. Alternatively, the total thickness measuring unit 110 and the thickness measuring unit 120 may be provided at the processing position A3, and the thickness measuring unit 130 may be provided at the delivery position A0. Moreover, a thickness measuring device (not shown) configured to detect an endpoint of the various kinds of grinding processings at the processing positions A1 to A3 is provided at each of the processing positions A1 to A3. When the thickness of the first wafer W measured by the thickness measuring device reaches a target thickness, the rotary table 30 is rotated to move the first wafer W. In addition, at the processing positions A2 and A3, the above-described thickness measuring units 120 and 130 may be used as the thickness measuring devices configured to perform the endpoint detection.

Figure 6:
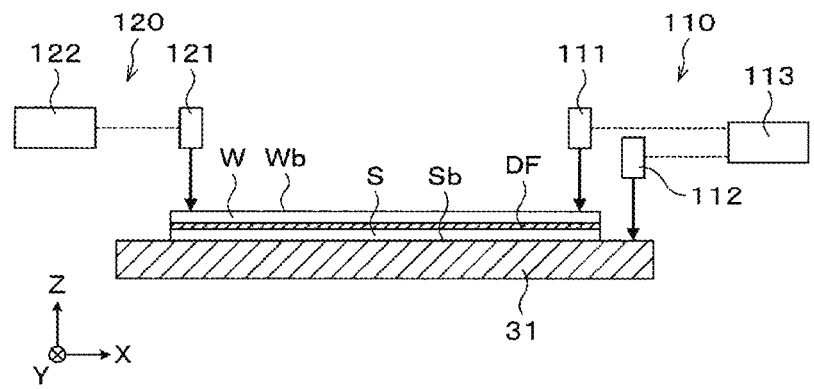
FIG. 6 is a side view schematically showing an example configuration of a total thickness measuring unit and a thickness measuring unit according to an exemplary embodiment.
Figure 7A:
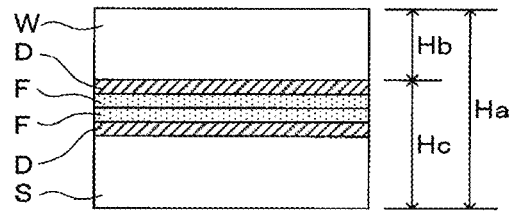
FIG. 7A and FIG. 7B are explanatory diagrams showing a total thickness of the combined wafer, a thickness of a first wafer, and a thickness of a second wafer.

As depicted in FIG. 6, the total thickness measuring unit 110 includes a wafer sensor 111, a chuck sensor 112, and an operation unit 113. The wafer sensor 111 is, for example, a non-contact type height sensor, and configured to measure the height of the rear surface Wb of the first wafer W at multiple points thereof. The chuck sensor 112 is, for example, a non-contact type height sensor, and configured to measure the height of the front surface of the chuck 31. Measurement results of the wafer sensor 111 and the chuck sensor 112 are respectively transmitted to the operation unit 113. In the operation unit 113, by subtracting the measurement result of the chuck sensor 112 (the height of the front surface of the chuck 31) from the measurement result of the wafer sensor 111 (the height of the rear surface Wb of the first wafer W), the total thickness of the combined wafer T is calculated. Further, in the operation unit 113, a distribution of the total thickness of the combined wafer T is obtained from the measurement results of the wafer sensor 111 at the multiple points, and TTV (Total Thickness Variation) data of the total thickness is obtained. Moreover, as shown in FIG. 7A, a total thickness Ha of the combined wafer T includes the thickness of the first wafer W (thickness of a silicon portion), the thicknesses of the device layers D, the thicknesses of the surface films F, and the thickness of the second wafer S (thickness of a silicon portion).

In addition, each of the wafer sensor 111 and the chuck sensor 112 may be a contact type height sensor.

As illustrated in FIG. 6, the thickness measuring unit 120 includes a sensor 121 and an operation unit 122. The sensor 121 is, for example, a non-contact type sensor using IR light, and configured to measure the thickness of the first wafer W. The sensor 121 measures the thickness of the first wafer W at multiple points thereof. Measurement results of the sensor 121 are transmitted to the operation unit 122. The operation unit 122 acquires a distribution of the thickness of the first wafer W from the measurement results (thicknesses of the first wafer W) of the sensor 121 at the multiple points. At this time, TTV data of the first wafer W may also be calculated. Further, as shown in FIG. 7A, a thickness Hb of the first wafer W measured by the thickness measuring unit 120 is just the thickness of the silicon portion of the first wafer W, and it does not include the thickness of the device layer D and the thickness of the surface film F.

Figure 7B:
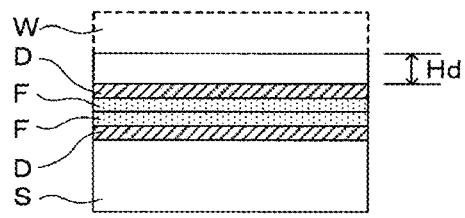

The thickness measuring unit 130 has the same configuration as the thickness measuring unit 120. In the thickness measuring unit 130, a distribution of the thickness of the first wafer W is acquired, and TTV data of the first wafer W is calculated. As shown in FIG. 7B, a thickness Hd of the first wafer W measured by the thickness measuring unit 130 is just the thickness of the silicon portion of the first wafer W, and it does not include the thickness of the device layer D and the thickness of the surface film F.

In addition, in the thickness measurement of the first wafer W using the thickness measuring units 120 and 130, the thickness of the first wafer W is measured at a plurality of measurement points in the diametrical direction of the first wafer W. At each of the plurality of measurement points in the diametrical direction, while rotating the combined wafer T, the thickness of the first wafer W is measured at multiple points in the circumferential direction. Then, a moving average value or a moving median value of the thicknesses measured at the multiple points in the circumferential direction is calculated, and the calculated value may be used as the thickness of the first wafer W at the corresponding measurement point in the diametrical direction.

Further, instead of using the moving average value or the moving median value of the multiple points as the thickness of the first wafer W, the thickness of the first wafer W at certain designated coordinates may be measured, and the measured thickness may be used as the thickness of the first wafer W as a representative value.

In addition, the configuration of the thickness measuring units 120 and 130 are not limited to the present exemplary embodiment, and any of various other configurations may be adopted as long as the thickness distribution and the TTV data of the first wafer W can be obtained.

As depicted in FIG. 3, the above-described processing apparatus 1 is equipped with a controller 140. The controller 140 is implemented by, for example, a computer equipped with a CPU and a memory, and includes a program storage (not shown). A program for controlling the processing of the combined wafer T in the processing apparatus 1 is stored in the program storage. Further, the program storage also stores therein a program for controlling operations of the above-described various kinds of processing units and a driving system such as the transfer devices to implement a processing to be described later in the processing apparatus 1. The program may be recorded on a computer-readable storage medium H and installed from the recording medium H to the controller 140.

Now, a processing method performed by using the processing apparatus 1 having the above-described configuration will be explained. In the present exemplary embodiment, the combined wafer T is previously formed by bonding the first wafer W and the second wafer S in a bonding apparatus (not shown) outside the processing apparatus 1. Further, the peripheral portion of the first wafer W is removed in advance.

First, the cassette Ct having therein a multiple number of combined wafers T is placed on the cassette placing table 10 of the carry-in/out station 2.

Then, the combined wafer T is taken out of the cassette Ct by the transfer fork 23 of the wafer transfer device 22, and transferred into the alignment unit 50 of the processing station 3.

In the alignment unit 50, by adjusting the position of the notch of the first wafer W while rotating the combined wafer T held by the spin chuck (not shown) as described above, the direction of the combined wafer T in the horizontal direction is adjusted.

Next, the combined wafer T is transferred from the alignment unit 50 to the delivery position A0 by the transfer unit 40, and handed over onto the chuck 31 located at the delivery position A0. Thereafter, the chuck 31 is moved to the first processing position A1. Then, the rear surface Wb of the first wafer W is roughly ground by the rough grinding unit 80. At this time, the rough grinding is ended at a time point when a set thickness of the first wafer W is measured at a predetermined point.

Subsequently, the chuck 31 is moved to the second processing position A2. Then, the rear surface Wb of the first wafer W is ground to an intermediate level by the intermediate grinding unit 90. At this time, the intermediate grinding is ended at a time point when a set total thickness of the combined wafer T or a set thickness of the first wafer W is measured at a predetermined point.

Next, the chuck 31 is moved to the third processing position A3. Then, the rear surface Wb of the first wafer W is ground finely by the finishing grinding unit 100. At this time, the finishing grinding is finished at a time point when a set total thickness of the combined wafer T or a set thickness of the first wafer W is measured at a predetermined point.

Thereafter, the chuck 31 is moved to the delivery position A0. Here, by using the cleaning liquid nozzle (not shown), the rear surface Wb of the first wafer W is roughly cleaned with the cleaning liquid. In this process, the cleaning is performed to reduce the contamination of the rear surface Wb to some extent.

Then, the combined wafer T is transferred from the delivery position A0 to the second cleaning unit 70 by the transfer unit 40. In the second cleaning unit 70, the rear surface Sb of the second wafer S is cleaned and dried in the state that the combined wafer T is held by the transfer pad 42.

Subsequently, the combined wafer T is transferred from the second cleaning unit 70 to the first cleaning unit 60 by the transfer unit 40. In the first cleaning unit 60, the rear surface Wb of the first wafer W is finally cleaned with the cleaning liquid by using the cleaning liquid nozzle (not shown). In this process, the rear surface Wb is cleaned to a required level of cleanliness and dried.

Thereafter, the combined wafer T after being subjected to all the required processings is transferred to the cassette Ct of the cassette placing table 10 by the transfer fork 23 of the wafer transfer device 22. Then, upon the completion of the processings on all the combined wafers T in the cassette Ct, a series of processings in the processing apparatus 1 is ended. In addition, in the processing apparatus 1, the processing of the combined wafers T may be performed in a single-wafer unit. That is, after the processing of one combined wafer T is finished, the processing of another combined wafer T may be started. Alternatively, the processings of the plurality of combined wafers T may be performed successively, that is, the processings of the plurality of combined wafers T in the processing apparatus 1 may be performed simultaneously.

In the processing apparatus 1 as described above, the processing is successively performed on the plurality of combined wafers T accommodated in the cassette Ct. In order to perform the grinding processing on the plurality of combined wafers T uniformly in the processing apparatus 1, that is, in order to uniformly control the thickness distribution of the first wafer W in each combined wafer T after being subjected to the finishing grinding, it is necessary to consider the thickness distribution in the surface of the second wafer S as described above. Hereinafter, the grinding method for the first wafer W considering the in-surface thickness of the second wafer S in the processing apparatus 1 will be explained.

In carrying out this grinding method, the processing apparatus 1 is equipped with, as illustrated in FIG. 4, the total thickness measuring unit 110 and the thickness measuring units 120 and 130. The total thickness measuring unit 110 measures the total thickness (total thickness distribution) of the combined wafer T after being subjected to the intermediate grinding and before being subjected to the finishing grinding. The thickness measuring unit 120 measures the thickness (thickness distribution) of the first wafer W after being subjected to the intermediate grinding and before being subjected to the finishing grinding. The thickness measuring unit 130 measures the thickness (thickness distribution) of the first wafer W after being subjected to the finishing grinding.

Figure 8A:
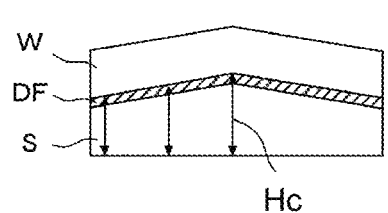
FIG. 8A and FIG. 8B are explanatory diagrams illustrating an example of main processes of a processing according to the exemplary embodiment.

In the present exemplary embodiment, for the combined wafer T to be processed in the processing apparatus 1, the rear surface Wb of the first wafer W is first roughly ground in the rough grinding unit 80, and, then, the rear surface Wb is ground to an intermediate level in the intermediate grinding unit 90 as shown in FIG. 7A and FIG. 8A. After the intermediate grinding, the total thickness Ha of the combined wafer T is measured by the total thickness measuring unit 110 at multiple points of the combined wafer T, and the distribution of the total thickness Ha is measured. Further, after the intermediate grinding, the thickness Hb of the first wafer W is measured by the thickness measuring unit 120 at multiple points of the first wafer W, and the distribution of the thickness Hb is measured. The measurement results of the total thickness measuring unit 110 and the measurement results of the thickness measuring unit 120 are respectively output to the controller 140.

In the controller 140, the thickness Hc of the second wafer S is calculated by subtracting the thickness Hb of the first wafer W from the total thickness Ha of the combined wafer T, as shown in the following expression (1). Further, the distribution of the thickness Hc of the second wafer S at the positions where the total thickness Ha and the thickness Hb are measured becomes the distribution of the corresponding thickness Hc.

[Thickness Hc]=[Total Thickness Ha]−[Thickness Hb]     (1)

The thickness Hc of the second wafer S includes, in addition to the thickness of the silicon portion of the second wafer S, thicknesses of the device layers D and the surface films F of the first wafer W and the second wafer S. In this way, in the present exemplary embodiment, it is possible to measure the thickness Hc of the second wafer S, which cannot be directly measured conventionally.

The controller 140 calculates the distribution of the thickness Hc of the second wafer S as described above. Then, based on the distribution of the thickness Hc, a grinding amount of the first wafer W in the finishing grinding is determined such that the thickness Hd of the first wafer W after being subjected to the finishing grinding becomes uniform in the surface thereof.

The grinding amount of the first wafer W in the finishing grinding is adjusted by adjusting, for example, a relative inclination of the chuck 31 with respect to the finishing grinding whetstone by the inclination adjuster 33 based on the distribution of the thickness Hc of the second wafer S. The inclination of the chuck 31 is decided by the controller 140.

Figure 8B:
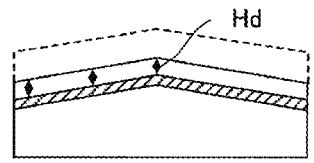

Next, as shown in FIG. 7B and FIG. 8B, the rear surface Wb of the first wafer W is finely ground in the finishing grinding unit 100. At this time, the inclination of the chuck 31 is adjusted by the inclination adjuster 33, and with the combined wafer T held by this chuck 31, the rear surface Wb is finely ground based on the grinding amount of the first wafer W determined by the controller 140. In this way, the first wafer W is ground to the thickness Hd which is uniform in the surface thereof.

According to the above-described exemplary embodiment, after the intermediate grinding and before the finishing grinding, the distribution of the total thickness Ha of the combined wafer T and the distribution of the thickness Hb of the first wafer W are measured, and from these measurement results, the distribution of the thickness Hc of the second wafer S, which could not be directly measured conventionally, can be acquired. Then, based on the distribution of the thickness Hc of the second wafer S, the inclination of the chuck 31 in the finishing grinding is appropriately adjusted, and the grinding amount of the first wafer W in the finishing grinding can be appropriately adjusted. As a result, the first wafer W is ground to the uniform thickness Hd in the surface thereof, so that the flatness of the first wafer W can be improved.

Now, a grinding method according to another exemplary embodiment will be discussed. In the following description, the $n^{th}$ sheet of combined wafer T to be processed in the processing apparatus 1 may sometimes be referred to as "combined wafer Tn". Likewise, the first wafer W and the second wafer S constituting the $n^{th}$ sheet of combined wafer T may sometimes be referred to as "first wafer Wn" and "second wafer Sn", respectively.

First, for the first sheet of combined wafer T1 among the plurality of combined wafers T, a rear surface of a first wafer W1 is roughly ground in the rough grinding unit 80, and, then, the rear surface is ground to an intermediate level in the intermediate grinding unit 90, as shown in FIG. 9A. After the intermediate grinding, a total thickness H1$a$ of the combined wafer T1 is measured at multiple points thereof by the total thickness measuring unit 110, and a distribution of the total thickness H1$a$ is calculated. Further, after the intermediate grinding, a thickness H1$b$ of the first wafer W1 is measured at multiple points thereof by the thickness measuring unit 120, and a distribution of the thickness H1$b$ is calculated. The measurement results of the total thickness measuring unit 110 and the measurement results of the thickness measuring unit 120 are respectively output to the controller 140. The controller 140 calculates a thickness H1$c$ of the second wafer S1 by using the expression (1) described above, and calculates a distribution of the thickness H1$c$ of the second wafer S1.

Further, the same as in the above-described exemplary embodiment, the controller 140 decides an inclination of the chuck 31 in the finishing grinding and a grinding amount of the first wafer W in the finishing grinding based on the distribution of the thickness H1$c$ of the second wafer S1. Here, the grinding amount of the first wafer W1 in the finishing grinding is adjusted by adjusting, for example, the relative inclination of the chuck 31 with respect to the finishing grinding whetstone by the inclination adjuster 33 and by adjusting the area of the finishing grinding whetstone that comes into contact with the first wafer W1 based on the distribution of the thickness H1$c$ of the second wafer S1.

Next, as shown in FIG. 9B, the rear surface of the first wafer W1 is finely ground in the finishing grinding unit 100. At this time, the inclination of the chuck 31 is adjusted by the inclination adjuster 33, and with the combined wafer T1 held by this chuck 31, the rear surface is finely ground based on the grinding amount of the first wafer W1 decided by the controller 140. Upon the completion of the finishing grinding, a thickness Hld of the first wafer W1 is measured at multiple points thereof by the thickness measuring unit 130, and a distribution of the thickness Hld is calculated. The measurement results of the thickness measuring unit 130 are output to the controller 140.

As stated above, since the first wafer W1 is finely ground based on the grinding amount decided based on the distribution of the thickness H1$c$, the flatness of the first wafer W1 can be improved, that is, the thickness H1$d$ of the first wafer W1 can be made uniform in the surface thereof, the same as in the above-described exemplary embodiment.

Here, in order to improve the flatness of the first wafer W1, it is desirable that the wear of the finishing grinding whetstone, the parallelism between the chuck 31 and the finishing grinding whetstone, or other device characteristics do not affect the flatness of the first wafer W1. Thus, in the present exemplary embodiment, when finely grinding a rear surface of a first wafer W2 in the second sheet of combined wafer T2 to be processed next, an inclination of the chuck 31 and a grinding amount of the first wafer W2 are determined by using the thickness H1d of the first wafer W1 after being subjected to the finishing grinding.

In the processing of the combined wafer T2, after the rear surface of the first wafer W2 is roughly ground in the rough grinding unit 80, the rear surface is ground to an intermediate level by the intermediate grinding unit 90, as illustrated in FIG. 9C. After the intermediate grinding, a total thickness H2$a$ of the combined wafer T2 is measured at multiple points thereof by the total thickness measuring unit 110, and a distribution of the total thickness H2$a$ is calculated. Further, after the intermediate grinding, a thickness H2$b$ of the first wafer W2 is measured at multiple points thereof by the thickness measuring unit 120, and a distribution of the thickness H2$b$ is calculated. The measurement results of the total thickness measuring unit 110 and the measurement results of the thickness measuring unit 120 are respectively output to the controller 140. The controller 140 calculates a thickness H2$c$ of a second wafer S2 by using the aforementioned expression (1), and calculates a distribution of the thickness H2$c$ of the second wafer S2.

In the controller 140, a TTV correction amount is calculated by adding a difference between the thickness H2$c$ of the second wafer S2 and the thickness H1$c$ of the second wafer S1 to the thickness H1$d$ of the first wafer W1, as indicated by the following expression (3). Here, the TTV correction amount is calculated based on the thicknesses obtained at the same point in the surface of the first wafer W and the second wafer S2.

[TTV correction amount]=[Thickness H1$d$ of the first wafer W1]+([Thickness H2$c$ of the second wafer S2]−[Thickness H1$c$ of the second wafer S1])    (3)

Then, based on the TTV correction amount, the inclination of the chuck 31 in the finishing grinding and the grinding amount of the first wafer W2 are decided such that the thickness H2$d$ of the first wafer W2 after being subjected to the finishing grinding becomes uniform in the surface thereof. Specifically, the relative inclination of the chuck 31 with respect to the finishing grinding whetstone is adjusted by the inclination adjuster 33.

Thereafter, as shown in FIG. 9D, the rear surface W2$b$ of the first wafer W2 is finely ground in the finishing grinding unit 100. At this time, the inclination of the chuck 31 is adjusted by the inclination adjuster 33, and with the combined wafer T2 held by this chuck 31, the rear surface W2$b$ is finely ground based on the grinding amount of the first wafer W2 decided by the controller 140. Accordingly, the first wafer W2 is ground to the uniform thickness H2$d$ in the surface thereof.

In addition, when the TTV of the thickness H2$c$ of the second wafer S2 and the TTV of the thickness H1$c$ of the second wafer S1 are same, it is unnecessary to adjust the inclination of the chuck 31 by the inclination adjuster 33. Further, a threshold may be set, and only when a difference between the TTV of the thickness H2$c$ of the second wafer S2 and the TTV of the thickness H1$c$ of the second wafer S1 is larger than the set threshold, the inclination of the chuck 31 may be adjusted by the inclination adjuster 33.

In the above-described another exemplary embodiment, the same effect as that of the previous exemplary embodiment can be obtained. That is, by appropriately adjusting the inclination of the chuck 31 in the finishing grinding, the first wafer W2 is ground to the uniform thickness H2d in the surface thereof, so that the flatness of the first wafer W2 can be improved.

Further, in the above-described exemplary embodiments, although the inclination of the chuck 31 is adjusted by the inclination adjuster 33 at the time of performing the finishing grinding, the inclination of the chuck 31 may be adjusted in processes other than the finishing grinding.

By way of example, in case of adjusting the inclination of the chuck 31 by the inclination adjuster 33 when the rough grinding is performed, the total thickness Ha of the combined wafer T is measured to calculate the distribution of the total thickness Ha, and, also, the thickness Hb of the first wafer W is measured to calculate the distribution of the thickness Hb before the rough grinding. Although these measurement positions are not particularly limited, the total thickness measuring unit 110 and the thickness measuring unit 120 may be provided in, for example, the alignment unit 50. Then, the distribution of the thickness Hc of the second wafer S is calculated, and the inclination of the chuck 31 is adjusted.

For another example, in case of adjusting the inclination of the chuck 31 by the inclination adjuster 33 when the intermediate grinding is performed, the total thickness Ha of the combined wafer T is measured to calculate the distribution of the total thickness Ha, and, also, the thickness Hb of the first wafer W is measured to calculate the distribution of the thickness Hb before the intermediate grinding. Although these measurement positions are not particularly limited, the total thickness measuring unit 110 and the thickness measuring unit 120 may be provided at, for example, the processing position A1. Then, the distribution of the thickness Hc of the second wafer S is calculated, and the inclination of the chuck 31 is adjusted.

As still another example, the inclination of the chuck 31 may be adjusted by the inclination adjuster 33 both when performing the rough grinding and when performing the intermediate grinding.

In any of these cases, if the inclination of the chuck 31 is adjusted in the process other than the finishing grinding, the adjustment amount of the inclination of the chuck 31 in the finishing grinding can be reduced. As a result, the throughput of the processing can be improved.

Further, as the TTV of the thickness Hc of the second wafer S is large, for example, it may not be possible to make uniform the thickness Hd of the first wafer W after being subjected to the finishing grinding even if the inclination of the chuck 31 is adjusted in the finishing grinding. In this case, by adjusting the inclination of the chuck 31 in a process other than the finishing grinding as well, the thickness Hd of the first wafer W may be made uniform.

Moreover, in the above-described exemplary embodiment, the processing apparatus 1 has the three grinding units (three-axis grinding) including the rough grinding unit 80, the intermediate grinding unit 90, and the finishing grinding unit 100. However, just two or one grinding unit may be provided. When two grinding units are provided, the inclination of the chuck 31 may be adjusted in the finishing grinding unit, or may be adjusted in the previous rough grinding unit as well. When only one grinding unit is provided, the inclination of the chuck 31 may be adjusted in this single grinding unit.

In the above-described exemplary embodiment, although the total thickness measuring unit 110 includes the wafer sensor 111, the chuck sensor 112, and the operation unit 113, the configuration of the total thickness measuring unit is not limited thereto. By way of example, a total thickness measuring unit 200 shown in FIG. 10 includes an upper sensor 201, a lower sensor 202, and an operation unit 203. The upper sensor 201 is, for example, a non-contact type height sensor, and configured to measure the height of rear surface Wb of the first wafer W at multiple points thereof. The lower sensor 202 is, for example, a non-contact type height sensor, and configured to measure the height of the rear surface Sb of the second wafer S at multiple points thereof. Specifically, the lower sensor 202 measures the height of the rear surface Sb through a through hole 210 formed through the chuck 31. The measurement point by the upper sensor 201 and the measurement point by the lower sensor 202 are opposite to each other, that is, the upper sensor 201 and the lower sensor 202 measure the combined wafer T interposed therebetween. The measurement results of the upper sensor 201 and the lower sensor 202 are respectively transmitted to the operation unit 203. In the operation unit 203, a difference between the measurement result of the upper sensor 201 (the height of the rear surface Wb of the first wafer W) and the measurement result of the lower sensor 202 (the height of the rear surface Sb of the second wafer S) is calculated as a total thickness of the combined wafer T. In addition, the operation unit 203 obtains a distribution of the total thickness of the combined wafer T from the measurement results of the upper sensor 201 and the lower sensor 202 at the multiple points, and calculates the TTV data of the total thickness.

In addition, each of the upper sensor 201 and the lower sensor 202 may be a contact-type height sensor.

Further, although the total thickness measuring unit 110 (200) is provided inside the processing apparatus 1 in the above-described exemplary embodiment, the total thickness measuring unit may be provided outside the processing apparatus 1. For example, the total thickness of the combined wafer T may be measured in the bonding apparatus configured to bond the first wafer W and the second wafer S, and the measured total thickness of the combined wafer T may be used.

In addition, in the above-described exemplary embodiment, the grinding amount of the first wafer W is adjusted by inclining the chuck base 32 with the inclination adjuster 33 as a way to improve the flatness of the first wafer W. However, the method of adjusting the grinding amount is not limited thereto. By way of example, the grinding amount of the first wafer W may be adjusted by inclining the grinding whetstone with the inclination adjuster 33. In addition, as long as the grinding amount of the first wafer W can be adjusted, the inclination adjuster 33 may not be used.

Furthermore, in the above-described embodiment, the thickness distribution data of the first wafer W1 before and after the finishing grinding are obtained, and the flatness of the first wafer W1 is adjusted based on the acquired thickness distribution data. However, the adjustment of the flatness may be carried out during the rough grinding or the intermediate grinding of the first wafer W1. That is, thickness distribution data before and after the rough grinding or thickness distribution data before and after the intermediate grinding may be further obtained, and based on the obtained thickness distribution data, the relative inclination of the chuck base 32 with respect to the grinding whetstone when performing the rough grinding or the intermediate grinding may be adjusted.

Moreover, the above exemplary embodiment has been described for the example where the thickness of the second substrate including the metal film cannot be measured due to the influence of the metal film(s) (device layer(s)) interposed between the first wafer W and the second wafer S. However, the technique of the present disclosure is not limited to being applied to the case where the combined wafer T has the metal film, but may be appropriately applied in any of various cases where the thickness of the second wafer S cannot be calculated properly.

In addition, in the above-described exemplary embodiment, a total thickness measuring unit (not shown) configured to measure the total thickness Ha of the combined wafer T before being subjected to the grinding processing, and a thickness measuring unit (not shown) configured to measure the thickness Hb of the first wafer W before being subjected to the grinding processing may be provided in, for example, the alignment unit 50. In this case, the thickness Hc of the second wafer S may be calculated from the total thickness Ha of the combined wafer T and the thickness Hb of the first wafer W before being subjected to the grinding processing, and the inclination of the chuck 31 in the finishing grinding may be adjusted based on this thickness Hc.

In addition, in the above-described exemplary embodiment, a thickness measuring unit (not shown) configured to measure the thickness Hb of the first wafer W after being subjected to the grinding processing may be provided in, for example, the first cleaning unit 60. In this case, the inclination of the chuck 31 in the finishing grinding may be adjusted based on the distribution of the thickness Hb of the first wafer W after being subjected to the grinding processing.

It should be noted that the above-described exemplary embodiment is illustrative in all aspects and is not anyway limiting. The above-described exemplary embodiment may be omitted, replaced and modified in various ways without departing from the scope and the spirit of claims.

According to the exemplary embodiments, it is possible to improve the flatness of the first substrate appropriately in the combined substrate in which the first substrate and the second substrate are bonded to each other.

We claim:

1. A substrate processing method of grinding a first substrate in a combined substrate in which the first substrate and a second substrate are bonded to each other, the substrate processing method comprising:
    measuring a total thickness distribution of the combined substrate;
    measuring a thickness distribution of the first substrate;
    calculating a thickness distribution of the second substrate by subtracting the thickness distribution of the first substrate from the total thickness distribution of the combined substrate;
    deciding a relative inclination between a substrate holder configured to hold the combined substrate and a grinder configured to grind the combined substrate, based on the thickness distribution of the second substrate; and
    grinding the first substrate while holding the combined substrate at the relative inclination which is decided,
    wherein the combined substrate includes multiple combined substrates, and the measuring of the total thickness distribution of the combined substrate, the measuring of the thickness distribution of the first substrate, the calculating of the thickness distribution of the second substrate, adjusting of the relative inclination, and the grinding of the first substrate are performed on the multiple combined substrates sequentially,
    wherein after performing the grinding of the first substrate on a first one of the multiple combined substrates, the measuring of the thickness distribution of the first substrate is performed, and
    wherein the adjusting of the relative inclination on a second one of the multiple combined substrates is performed based on a thickness distribution correction amount obtained by adding, to the thickness distribution of the first substrate of the first one of the multiple combined substrates after being subjected to the grinding, a difference between the thickness distribution of the second substrate of the first one of the multiple combined substrates and the thickness distribution of the second substrate of the second one of the multiple combined substrates.

2. The substrate processing method of claim 1,
    wherein the grinder includes multiple grinders,
    the grinding of the first substrate comprises multiple grindings successively performed in different grinders, and
    the relative inclination is adjusted in a finishing grinding performed last among the multiple grindings.

3. The substrate processing method of claim 2,
    wherein the relative inclination is adjusted in any of the multiple grindings other than the finishing grinding.

4. The substrate processing method of claim 1,
    wherein the measuring of the total thickness distribution of the combined substrate is performed inside a substrate processing apparatus configured to perform the grinding of the first substrate, and
    a height of a front surface of the substrate holder configured to hold the combined substrate and a height of a front surface of the combined substrate held by the substrate holder are measured, and a difference between the height of the front surface of the combined substrate and the height of the front surface of the substrate holder is calculated as the total thickness distribution of the combined substrate.

5. The substrate processing method of claim 1,
    wherein the measuring of the total thickness distribution of the combined substrate is performed inside a substrate processing apparatus configured to perform the grinding of the first substrate, and
    a height of a front surface and a height of a rear surface of the combined substrate held by the substrate holder configured to hold the combined substrate are measured, and a difference between the height of the front surface and the height of the rear surface is calculated as the total thickness distribution of the combined substrate.

6. The substrate processing method of claim 1,
    wherein the measuring of the total thickness distribution of the combined substrate is performed outside a substrate processing apparatus configured to perform the grinding of the first substrate.

* * * * *